United States Patent [19]
Becker et al.

[11] Patent Number: 5,004,984
[45] Date of Patent: Apr. 2, 1991

[54] MAGNETIC FIELD PICKUP ASSEMBLY FOR DIAGNOSITICS ON SPECIFIC ENGINE

[75] Inventors: Thomas P. Becker, Kenosha, Wis.; Sohrab S. Rameshk, Libertyville, Ill.; Matthew M. Crass, Kenosha, Wis.

[73] Assignee: Snap-on Tools Corporation, Kenosha, Wis.

[21] Appl. No.: 404,430

[22] Filed: Sep. 8, 1989

[51] Int. Cl.⁵ .............................................. F02P 17/00
[52] U.S. Cl. ................................ 324/402; 324/379; 324/380; 324/388; 324/226; 324/243
[58] Field of Search ............... 324/402, 378, 384, 379, 324/380, 388, 226, 243

[56] References Cited
U.S. PATENT DOCUMENTS

| 3,793,583 | 2/1974 | Glomski et al. | 324/402 |
| 3,959,725 | 5/1976 | Capek | 324/388 X |
| 4,010,415 | 3/1977 | Reeves et al. | 324/379 |
| 4,010,419 | 3/1977 | Reeves et al. | 324/379 |
| 4,101,859 | 7/1978 | Reeves et al. | 324/402 X |
| 4,291,383 | 9/1981 | Tedeschi et al. | 364/551 |
| 4,305,038 | 12/1981 | Luzynski | 324/384 X |
| 4,587,486 | 5/1986 | Soyck | 324/207.26 X |
| 4,644,284 | 2/1987 | Friedline et al. | 324/384 X |
| 4,708,121 | 11/1987 | Everett et al. | 324/379 X |
| 4,758,791 | 7/1988 | Tedeschi et al. | 324/378 X |

Primary Examiner—Kenneth Wieder
Assistant Examiner—Robert W. Mueller
Attorney, Agent, or Firm—Emrich & Dithmar

[57] ABSTRACT

An inductive pickup assembly senses the electromagnetic fields of plural ignition elements of an automotive engine, access to which elements is prevented by associated engine housing structure. The pickup assembly includes a frame having a flat platform on which multiple sensors are mounted, each sensor comprising an electromagnetic pickup coil with a magnetizable metal core integral with a magnetizable metal shield plate which covers one end of the coil. The frame has a support member with depending feet having apertures which mate with fasteners on the housing structure to serve as a template for accurately locating the pickup assembly on the housing structure.

10 Claims, 1 Drawing Sheet

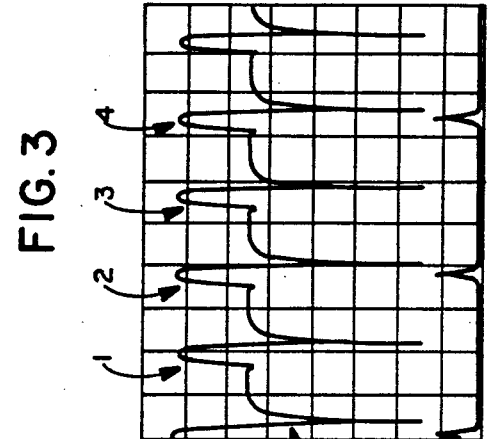
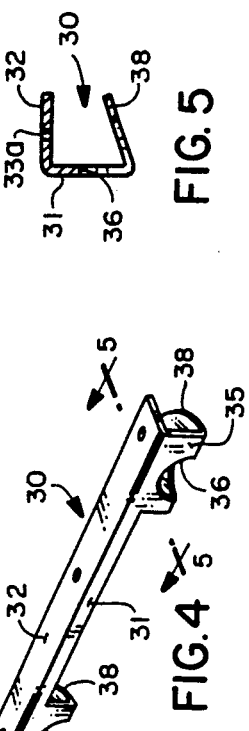
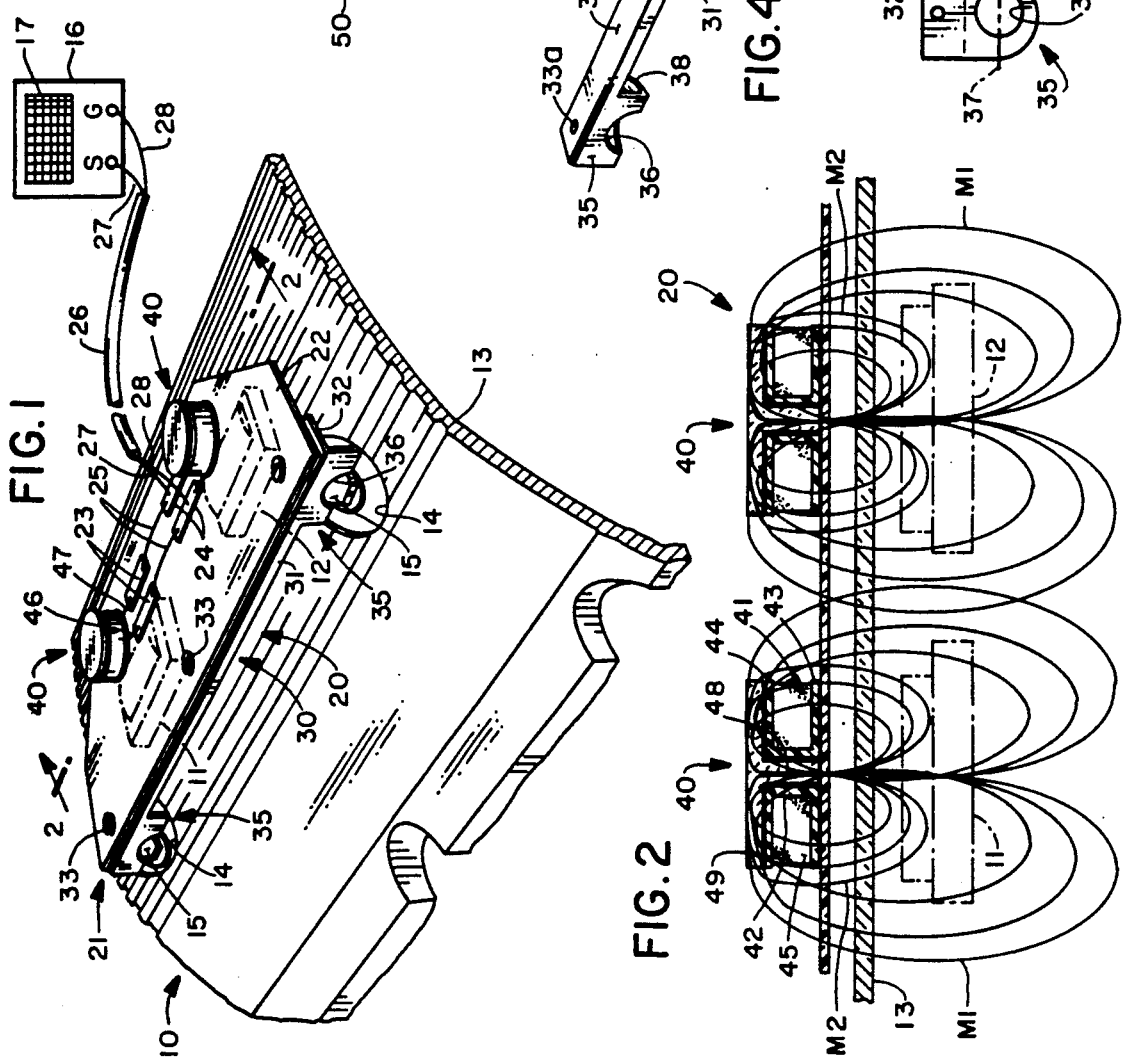
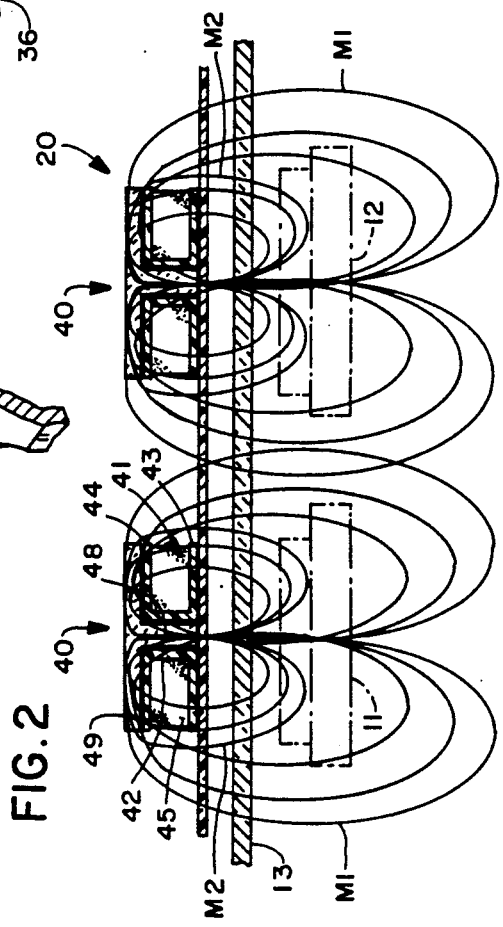

MAGNETIC FIELD PICKUP ASSEMBLY FOR DIAGNOSITICS ON SPECIFIC ENGINE

BACKGROUND OF THE INVENTION

1. Field of the Invention

The invention relates to automotive engine ignition diagnostics, and specifically to pickup probe devices for detecting characteristic engine output signals for display and analysis on suitable diagnostic equipment. The invention has particular application to non-intrusive pickup probe devices which do not require physical connection to the engine being analyzed.

2. Description of the Prior Art

Diagnostic systems for automotive engines are well known. Such systems typically have a display device, such as an oscilloscope, and a plurality of probe elements adapted to be coupled or connected to various components of the engine being analyzed for detecting a variety of engine output signals to analyze different engine operating conditions. Many of the conditions diagnosed by such systems relate to the ignition system of the automobile engine, and require access to the wires leading to the spark plugs, ignition coil, distributor and the like.

But recently new electronic engine ignitions have been used by automotive manufacturers. These systems include Distributorless Ignition Systems (DIS) wherein spark plugs are paired and fired simultaneously, and Direct Ignition (DI) wherein each spark plug has its own ignition coil. These systems facilitate complex computer control of engine function and do not require use of a distributor. Present oscilloscope diagnostics are not usable on these systems, at least in part because of inaccessibility of key portions of the ignition systems. For example, in such systems, the ignition coils are typically disposed beneath a shroud or cowl, so that there is no ready access to the primary and/or secondary wires of the ignition coils. Accordingly, current diagnostic systems which require direct connection or other coupling to the wires of the ignition coil cannot readily be used with the new types of electronic ignition systems.

In our copending U.S. application Ser. No. 404,518, filed Sept. 8, 1989, entitled "Magnetic Field Pickup for Automotive Engine Diagnostics" we disclose a handheld pickup probe incorporating a unique electromagnetic sensing coil which provides an effective non-intrusive magnetic field pickup probe useful with electronic ignition systems. However, that probe requires each individual ignition element, such as an ignition coil, under test to be separately tested by the technician who must manually reposition the probe for each such coil.

SUMMARY OF THE INVENTION

It is a general object of the present invention to provide an improved pickup assembly for automotive ignition diagnostics which avoids the disadvantages of prior pickup probes while affording additional structural and operating advantages.

An important feature of the invention is the provision of an inductive pickup assembly for automotive ignition diagnostics which are hidden by associated engine housing structure, and which is accurately positionable on the housing structure for optimum signal sensing.

In connection with the foregoing feature, it is another feature of the invention to provide an inductive pickup assembly of the type set forth, which includes multiple sensors for respectively sensing signals from multiple ignition elements.

Another feature of the invention is the provision of a pickup assembly of the type set forth, which includes template means cooperating with the engine housing structure to assure optimum positioning of the assembly.

In connection with the foregoing features, yet another feature of the invention is the provision of a pickup assembly which is of simple and economical construction.

These and other features of the invention are attained by providing an inductive pickup assembly for sensing the electromagnetic field of an ignition element of an automotive engine, which element is hidden by associated engine housing structure from direct access by test equipment, the pickup assembly comprising: a frame disposable on the housing structure in a predetermined configuration, and inductive coil sensing means carried by the frame in a predetermined position such that when the frame is disposed in its predetermined configuration on the housing structure the sensing means is properly positioned for sensing the electromagnetic field of the ignition element.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

FIG. 1 is a perspective view of a pickup assembly constructed in accordance with the present invention, and illustrated in its use configuration on an associated engine cowl and shown coupled to an associated diagnostic monitor;

FIG. 2 is an enlarged, fragmentary view in vertical section, taken generally along the line 2—2 in FIG. 1, and illustrating the magnetic fields induced in the pickup sensors by the magnetic fields from associated ignition coils;

FIG. 3 is a waveform diagram of a typical output waveform from the pickup assembly of FIG. 1;

FIG. 4 is a perspective view of the template member of the pickup assembly of FIG. 1;

FIG. 5 is an enlarged view in vertical section taken along the line 5—5 in FIG. 4; and FIG..6 is a plan view of the template member of FIG. 4, prior to ending into the configuration illustrated in FIG. 4.

DESCRIPTION OF THE PREFERRED EMBODIMENT

Referring to FIGS. 1 and 2, there is illustrated a portion of an electronic ignition system 10 of a type with which the present invention is useful. The ignition system 10 may be of any of several types, but for purposes of illustration, the ignition system 10 illustrated is that for a "Quad 4" engine of the type manufactured and sold by General Motors Corporation. This type of engine has four cylinders and two ignition coils 11 and 12, each of which coils controls the firing of two cylinders. The ignition coils 11 and 12 are mounted, in use, beneath a cowl 13 which is typically formed of an aluminum material. The cowl 13 is provided with circular recesses 14 in the outer surface thereof which surround complementary openings (not shown) through the cowl 13 for receiving associated headed fasteners 15 to securely mount the cowl 13 on the associated engine. Also illustrated in FIG. 1 is an oscilloscope 16 having a viewing screen 17 for displaying ignition signals detected by the present invention. The oscilloscope 16 may form a part of a larger ignition diagnostic system, in a known manner.

Also illustrated in FIGS. 1 and 2 is an inductive pickup assembly 20, constructed in accordance with and embodying the features of the present invention. The pickup assembly 20 includes a frame 21 having a flat platform 22 formed of a suitable non-magnetizable material, such as an epoxy circuit board. Formed on the upper surface of the platform 22 are a pair of solder strips 23 and a pair of solder strips 24, corresponding strips of each pair being interconnected by suitable connections 25, which may be in the form of printed circuit connections on the platform 22. There is also provided a cable 26, which may be a shielded cable including conductors 27 and 28, adapted to be connected, respectively, to the solder strips of either of the pairs 23 or 24 at one end of the cable 26, and to the signal and ground input terminals of the oscilloscope 16 at the other end of the cable 26.

Referring now also to FIGS. 4-6, the frame 21 also includes a template member 30 which has a main wall 31 provided with a rectangular attachment flange 32 which projects therefrom substantially perpendicular thereto. In use, the attachment flange is disposed beneath the platform 22 adjacent to one edge thereof and is fixedly secured thereto by suitable fasteners 33 which extend through complementary openings 33a in the attachment flange 32. The attachment flange 32 is formed by bending the upper half of the wall 31 along bend line 34 (FIG. 6). Depending from the main wall 31 at opposite ends thereof are two rounded feet 35, which respectively have circular openings 36 formed therethrough. The feet 35 are respectively bent along bend lines 37 extending diametrically through the openings 36 to define upwardly inclined portions 38. The feet 35 are positioned and dimensioned so as respectively to be disposable in the recesses 14 of the cowl 13, with the headed fasteners 15 being respectively accommodated in the openings 36, as illustrated in FIG. 1. The feet 35 have rounded ends which respectively mate with the upper halves of the recesses 14. Thus, it will be appreciated that the member 30 serves as a template to accurately position the frame 21 on the cowl 13 in a predetermined configuration.

Mounted on the platform 22 are two sensors 40, which are identical in construction, wherefore only one will be described in detail. Each of the sensors 40 is preferably of the type described in our aforementioned copending U.S. application Ser. No. 404,518, the disclosure of which is incorporated herein by reference. Referring to FIG. 2, each of the sensors 40 includes a bobbin 41 having a hollow cylindrical hub 42 integral at the opposite ends thereof with circular end plates 43 and 44, which respectively extend radially outwardly from the hub 42 coaxially therewith. The bottom one 43 of the end plates is disposed on the upper surface of the platform 22 and may be fixedly secured thereto by suitable means, such as an adhesive. Wound on the bobbin 41 is a helical coil 45 of electrically conductive wire having end terminals 46 and 47 which are respectively connected to the solder strips of the associated pair (23 or 24) thereof. The sensor 40 also includes a cylindrical core 48 of magnetizable metal which is disposed coaxially within the bobbin hub 42 and is integral at its upper end with a circular shield plate 49 of magnetizable metal which overlies and covers the upper end plate 44 of the bobbin 41 substantially congruent therewith.

The sensors 40 are respectively positioned at predetermined locations on the platform 22 such that, when the frame 21 is accurately located in the cowl 13 in its predetermined configuration, as illustrated in FIG. 1, by means of the template member 30, the sensors 40 will be respectively disposed immediately over the ignition coils 11 and 12 of the ignition system 10. More specifically, the sensors 40 will preferably be positioned so as to detect the primary magnetic fields M1 of the ignition coils 11 and 12, which magnetic fields will respectively induce in the sensors 40 magnetic fields M2, as illustrated in FIG. 2. The shield plates 49 of the sensors 40 will serve to make them respectively uni-directional, as is explained in greater detail in our aforementioned copending application Ser. No. 404,518, so as to render the sensors 40 substantially insensitive to magnetic fields other than those which they are intended to detect.

The induced magnetic fields M2 will tend to produce in each of the sensors 40 an output signal at its terminals 46 and 47. In the configuration illustrated in FIG. 1, it will be appreciated that the sensors 40 are connected in parallel. Thus, there will be produced on the screen 17 of the oscilloscope 16 a waveform 50 which is in the nature of a "parade pattern", which shows the firing of each of the cylinders in sequence, these cylinder firings being respectively designated by numerals 1, 2, 3, and 4 in the waveform 50 of FIG. 3. Typically, one of the ignition coils, such as coil 11 will fire the spark plugs for the cylinders 1 and 3, while the other ignition coil, e.g. coil 12, will fire the other two cylinders 2 and 4.

In use, the technician places the inductive pickup assembly 20 on the cowl 13 of the engine under test, utilizing the template member 30 to accurately position the pickup assembly 20 in its predetermined optimum configuration. Thus, the recesses 14 and fasteners 15 serve as indicia for accurate location of the template member 30. More specifically, the feet 35 are respectively positioned in the recesses 14 in the manner illustrated in FIG. 1, and the sensors 40 will then automatically be positioned in their optimum locations. The sensors 40 are then connected to the oscilloscope 16 by means of the cable 26. While the conductors 27 and 28 of the cable 26 have been illustrated in FIG. 1 as being connected to the solder strips 24, it will be appreciated that the conductors 27 and 28 may be connected to probe tips which may simply be engaged manually with the solder strips 23 or 24. The "parade pattern" 50 generated by the ignition coils 11 and 12 will then appear on the oscilloscope screen 17 for analysis by the technician.

While the pickup assembly 20 has been illustrated in a form and configuration specifically designed for use with a "Quad 4" engine, it will be appreciated that the same principles would apply for use with other types of electronic ignition systems. Thus, it will be appreciated that more than two sensors 40 could be mounted on the frame 21 and positioned in accordance with the arrangement of the ignition coils in the particular ignition system with which the pickup assembly is to be used.

From the foregoing, it can be seen that there has been provided an improved inductive pickup assembly which provides for accurate positioning of multiple electromagnetic field sensors for simultaneous sensing of a plurality of ignition elements, the pickup assembly being of simple and economical construction and suitable for accurate non-intrusive sensing of signals from ignition elements which are not readily accessible.

We claim:

1. An inductive pickup assembly for sensing the electromagnetic fields of ignition coils of an automotive engine having a plurality of such ignition coils, direct access to which ignition coils is prevented by associated engine housing structure mounted by fastening means, said pickup assembly comprising:

a frame disposable on the housing structure in a predetermined configuration, said frame having a plurality of locating members adapted for cooperation with fastening means accurately to position said frame in said predetermined configuration, and a plurality of inductive coil sensing means equal in number to the ignition coils and carried by said frame in predetermined positions such that when said frame is disposed in its predetermined configuration on the housing structure said sensing means are respectively properly positioned for sensing the electromagnetic fields of the ignition coils, each of said sensing means including a helical sensing coil of electrically conductive wire having an axis extending between opposite ends of the sensing coil, and a magnetizable metal shield covering only one end of said sensing coil.

2. The pickup assembly of claim 1, wherein said locating members respectively include aperture means mateable with the fastening means to accurately locate said frame on the housing structure.

3. The pickup assembly of claim 2, wherein said frame includes a flat platform, said locating members including a plurality of feet depending from said platform for cooperation with the fastening means.

4. The pickup assembly of claim 1, wherein each of said sensing means has a pair of terminals, and further comprising a plurality of solder strips on said frame respectively connected to said terminals.

5. The pickup assembly of claim 1, wherein said two sensing means are connected in parallel.

6. The pickup assembly of claim 1, wherein said sensing means further includes a bobbin of non-magnetizable material, said sensing coil being would on said bobbin.

7. The pickup assembly of claim 6, wherein said bobbin includes a cylindrical hub and a pair of annular end plates extending radially outwardly from said hub at opposite ends thereof, said sensing coil being wound around said hub between said end plates, said metal shield covering one of said end plates.

8. The pickup assembly of claim 6, wherein said bobbin is formed of a plastic material.

9. The pickup assembly of claim 1, wherein said metal shield is circular and coaxial with said sensing coil.

10. The pickup assembly of claim 1, wherein said sensing means includes a cylindrical core of magnetizable material coaxial with said axis, said metal shield being integral with said core at one end thereof.

* * * * *

UNITED STATES PATENT AND TRADEMARK OFFICE
CERTIFICATE OF CORRECTION

PATENT NO. : 5,004,984

DATED : April 2, 1991

INVENTOR(S) : Thomas P. Becker et al.

It is certified that error appears in the above-identified patent and that said Letters Patent is hereby corrected as shown below:

Column 6, line 19, "would" should be --wound--.

Signed and Sealed this

Eleventh Day of August, 1992

Attest:

DOUGLAS B. COMER

Attesting Officer     Acting Commissioner of Patents and Trademarks